US010585142B2

(12) United States Patent
Kusko et al.

(10) Patent No.: US 10,585,142 B2
(45) Date of Patent: Mar. 10, 2020

(54) FUNCTIONAL DIAGNOSTICS BASED ON DYNAMIC SELECTION OF ALTERNATE CLOCKING

(71) Applicant: International Business Machines Corporation, Armonk, NY (US)

(72) Inventors: Mary P. Kusko, Hopewell Junction, NY (US); Franco Motika, Hopewell Junction, NY (US); Gerard M. Salem, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/718,271

(22) Filed: Sep. 28, 2017

(65) Prior Publication Data
US 2019/0094297 A1    Mar. 28, 2019

(51) Int. Cl.
*G01R 31/317* (2006.01)
*G01R 31/3177* (2006.01)
*G01R 31/3183* (2006.01)

(52) U.S. Cl.
CPC ... *G01R 31/31725* (2013.01); *G01R 31/3177* (2013.01); *G01R 31/31707* (2013.01);
(Continued)

(58) Field of Classification Search
CPC ............. G01R 31/28; G01R 31/31858; G01R 31/3177; G01R 31/31725; G01R 31/318594; G01R 31/318552
See application file for complete search history.

(56) References Cited

U.S. PATENT DOCUMENTS

| 3,761,695 A | 9/1973 | Eichelberger |
| 3,784,907 A | 1/1974 | Eichelberger |
(Continued)

FOREIGN PATENT DOCUMENTS

| EP | 0556826 A2 | 8/1993 |
| JP | 2005233957 | 9/2005 |
(Continued)

OTHER PUBLICATIONS

Kusko et al., "Functional Diagnostics Based on Dynamic Selection of Alternate Clocking"; U.S. Appl. No. 15/805,586, filed Nov. 7, 2017.
(Continued)

*Primary Examiner* — Shelly A Chase
(74) *Attorney, Agent, or Firm* — Cantor Colburn LLP; Margaret McNamara

(57) ABSTRACT

An embodiment of the present invention provides a computer-implemented method for functional test and diagnostics of integrated circuits. The computer-implemented method includes executing one or more functional test exercisers in a functional execution sequence for a device under test up to one or more checkpoints, applying dynamic clock switching to a clock of the device under test to identify one or more likely causes of a failure identified at the one or more checkpoints, and includes iteratively invoking a portion of the functional execution sequence between a plurality of the checkpoints to progressively isolate the one or more likely causes of the failure as a most likely failure source based at least in part on the applied dynamic clock switching.

13 Claims, 13 Drawing Sheets

(52) U.S. Cl.
CPC ............. *G01R 31/318342* (2013.01); *G01R 31/318371* (2013.01)

(56) References Cited

U.S. PATENT DOCUMENTS

| | | | |
|---|---|---|---|
| 4,503,537 A | 3/1985 | McAnney | |
| 4,513,418 A | 4/1985 | Bardell, Jr. et al. | |
| 4,688,222 A * | 8/1987 | Blum .................. | G06F 11/27 714/732 |
| 5,136,590 A | 8/1992 | Polstra et al. | |
| 5,369,648 A | 11/1994 | Nelson | |
| 5,694,402 A | 12/1997 | Butler et al. | |
| 5,784,383 A | 7/1998 | Meaney | |
| 5,983,380 A | 11/1999 | Motika et al. | |
| 6,018,815 A | 1/2000 | Baeg | |
| 6,311,311 B1 | 10/2001 | Swaney et al. | |
| 6,327,685 B1 | 12/2001 | Koprowski et al. | |
| 6,442,723 B1 | 8/2002 | Koprowski et al. | |
| 6,463,560 B1 | 10/2002 | Bhawmik et al. | |
| 6,484,280 B1 | 11/2002 | Moberly | |
| 6,516,432 B1 | 2/2003 | Motika et al. | |
| 6,636,997 B1 | 10/2003 | Wong et al. | |
| 6,658,617 B1 | 12/2003 | Wong | |
| 6,807,645 B2 | 10/2004 | Angelotti et al. | |
| 6,807,646 B1 | 10/2004 | Williams et al. | |
| 6,836,866 B2 | 12/2004 | Nolles et al. | |
| 6,961,886 B2 | 11/2005 | Motika et al. | |
| 7,017,095 B2 | 3/2006 | Forlenza et al. | |
| 7,191,373 B2 | 3/2007 | Wang et al. | |
| 7,363,560 B1 | 4/2008 | Mark et al. | |
| 7,376,875 B2 | 5/2008 | Hilgendorf et al. | |
| 7,546,504 B2 | 6/2009 | Riley et al. | |
| 7,574,644 B2 | 8/2009 | Forlenza et al. | |
| 7,657,764 B2 | 2/2010 | Jorgenson et al. | |
| 7,793,184 B2 | 9/2010 | Douskey | |
| 7,840,861 B2 * | 11/2010 | Sul .................. | G01R 31/3185 714/726 |
| 8,122,312 B2 | 2/2012 | Floyd et al. | |
| 8,230,283 B2 * | 7/2012 | Gillis ............. | G01R 31/31858 714/731 |
| 8,843,797 B2 | 9/2014 | Motika et al. | |
| 9,057,766 B2 | 6/2015 | Al-Omari et al. | |
| 9,292,398 B2 | 3/2016 | Cook et al. | |
| 9,297,855 B1 | 3/2016 | Jindal et al. | |
| 9,448,282 B1 | 9/2016 | Meehl | |
| 2002/0046377 A1 | 4/2002 | Kniffler et al. | |
| 2004/0004482 A1 | 1/2004 | Bouabdo et al. | |
| 2004/0230882 A1 | 11/2004 | Huott et al. | |
| 2005/0097418 A1 | 5/2005 | Anzou et al. | |
| 2006/0200719 A1 | 9/2006 | Keller | |
| 2007/0040570 A1 | 2/2007 | Gopal et al. | |
| 2007/0132471 A1 | 6/2007 | Carlson | |
| 2008/0320347 A1 | 12/2008 | Cussonneau et al. | |
| 2012/0159273 A1 | 6/2012 | Douskey et al. | |
| 2015/0212916 A1 | 7/2015 | Lu | |
| 2016/0033571 A1 | 2/2016 | Forlenza et al. | |
| 2016/0178696 A1 | 6/2016 | Bhamidipati et al. | |
| 2016/0349318 A1 | 12/2016 | Pereira et al. | |

FOREIGN PATENT DOCUMENTS

| | | |
|---|---|---|
| JP | 2008249481 A | 10/2008 |
| JP | 2013088400 A | 5/2013 |

OTHER PUBLICATIONS

List of IBM Patents or Patent Applications Treated As Related; Date Filed: Nov. 7, 2017, 2 pages.

Kusko et al., "Non-Destructive Recirculation Test Support for Integrated Circuits," U.S. Appl. No. 15/439,176, filed Feb. 22, 2017.

Kusko et al., "Structurally Assisted Functional Test and Diagonostics for Integrated Circuits," U.S. Appl. No. 15/439,161, filed Feb. 22, 2017.

List of IBM Patents or Patent Applications Treated As Related; Date Filed: Sep. 28, 2017, 2 pages.

Parvathala et al.; "FRITS—A Microprocessor Functional BIST Method"; ITC International Test Conference; 2002 IEEE; 9 pages.

Rodriguez-Irago et al.; "Dynamic Fault Test and Diagnosis in Digital Systems Using Multiple Clock Schemes and Multi-VDD Test"; 11th IEEE International On-Line Testing Symposium; 2005; 6 pages.

Song et al.; "Diagnostic Techniques for the IBM S/390 600 MHz G5 Microprocessor"; IEEE Xplore Conference Paper; Feb. 1999; 11 pages.

B. Konemann, et al., "Built-In Test for Complex Digital Integrated Circuits," IEEE Journal of Solid State Circuits, vol. SC-15, pp. 315-318, Jun. 1980, 2 pages.

E. Eichelberger, et al., "A Logic Design Structure for LSI Testability," Proceedings of the 14th Design Automation Conf., New Orleans, Jun. 1977, 7 pages.

He et al., "Test-Point Insertion Efficiency Analysis for LBIST Applications," Apr. 2016 IEEE 34th VLSI Test Symposium (VTS), 6 pages.

ip.com et al., "High Speed Test Time Scan Chain Diagnostics Using LBIST STUMPS Segmented Patterns and High Speed Digital Capture Memory," Aug. 6, 2012, 6 pages.

ip.com et al., "Method of Diagnosing Intermittent Logic Built-In Self Test Pattern Sequence Dependencies," Sep. 15, 2004, 5 pages.

P. Song, et al., S/390 G5 CMOS microprocessory diagnostics, IBM J. Res. Develop., vol. 43 No. 5/6 Sep./Nov. 1999, 16 Pages.

R. Kapur, et al., "New Approach Moves logic BIST Into Mainstream," EEdesign, Oct. 14, 2002, 4 pages.

* cited by examiner

FUNCTIONAL DIAGNOSTICS BASED ON DYNAMIC SELECTION OF ALTERNATE CLOCKING

BACKGROUND

The present invention generally relates to integrated circuit testing, and more specifically, to functional test and diagnostics for integrated circuits.

When developing integrated circuit systems, resulting devices need to be tested and faults diagnosed. A common diagnostic approach in the industry uses post-test software algorithms that run on fail data collected on a test system. To generate the data, patterns can be applied to a device under test and the responses collected. Failing responses can be fed into design automation software which analyzes the fail data and gives suspected callouts for the defect detected. A set of faults is associated with each design. A typical fault model is the "stuck-at" fault model, which includes both a stuck-at-1 and stuck-at-0 fault. The design is typically a gate-level representation (AND, OR, XOR, etc.), and the faults are applied at the inputs and outputs of each logic block. Based on a complete list of faults, diagnostic software typically produces a callout identifying the most likely faults to explain the faulty response. The goal is to have a precise enough callout so that physical failure analysis can be done on the device under test to identify the physical defect and determine the root cause.

Generally, there are two types of diagnostic techniques: cause-effect analysis techniques and effect-cause analysis techniques. Cause-effect techniques depend on stored symptoms caused by possible faults and use the observed responses to locate the fault. A fault dictionary approach is one such example. Problems with this approach, especially for large chips, can include excessively long simulation run time with prohibitively large memory requirements and ineffective physical and electrical failure analysis due to low diagnostic resolution. In contrast, effect-cause techniques do not depend on pre-stored data but instead process the response obtained from the device under test to determine the possible faults that generate the response. Effect-cause algorithms are less processing resource intensive and are well suited to fault diagnostics. Software diagnostic techniques are typically faster than other methods; however, fault candidates can be wrong or there can be too many candidates with low scores. A fault with a low score is one with a low probability of explaining the failure. This can result from incomplete fail data, un-modeled fault types such as path delay and bridging faults, and faults in areas of logic that are not fully represented in the fault model (such as clock logic). All of these have resulted in a need for better, improved systems and methods.

SUMMARY

An embodiment of the present invention provides a computer-implemented method for functional test and diagnostics of integrated circuits. A non-limiting example of the computer-implemented method includes executing, by a test and diagnostic system, one or more functional test exercisers in a functional execution sequence for a device under test, up to one or more checkpoints. The method further includes applying, by the test and diagnostic system, dynamic clock switching to a clock of the device under test to identify one or more likely causes of a failure identified at the one or more checkpoints. The method further includes iteratively invoking, by the test and diagnostic system, a portion of the functional execution sequence between a plurality of the checkpoints to progressively isolate the one or more likely causes of the failure as a most likely failure source based at least in part on the applied dynamic clock switching.

An embodiment of the present invention provides a system for functional test and diagnostics of integrated circuits. A non-limiting example of the system includes a device under test and a test and diagnostic system. The device under test includes one or more functional test exercisers. The test and diagnostic system includes a processor operable to initiate execution of a functional execution sequence in the one or more functional test exercisers up to one or more checkpoints, apply dynamic clock switching to a clock of the device under test to identify one or more likely causes of a failure identified at the one or more checkpoints, and iteratively invoke a portion of the functional execution sequence between a plurality of the checkpoints to progressively isolate the one or more likely causes of the failure as a most likely failure source based at least in part on the applied dynamic clock switching.

An embodiment of the present invention provides a computer program product for functional test and diagnostics of integrated circuits, the computer program product comprising a computer readable storage medium having program instructions embodied therewith. The program instructions are executable by a processor to cause the processor to perform a method. A non-limiting example of the method includes executing, by a test and diagnostic system, one or more functional test exercisers in a functional execution sequence for a device under test, up to one or more checkpoints. The method further includes applying, by the test and diagnostic system, dynamic clock switching to a clock of the device under test to identify one or more likely causes of a failure identified at the one or more checkpoints. The method further includes iteratively invoking, by the test and diagnostic system, a portion of the functional execution sequence between a plurality of the checkpoints to progressively isolate the one or more likely causes of the failure as a most likely failure source based at least in part on the applied dynamic clock switching.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
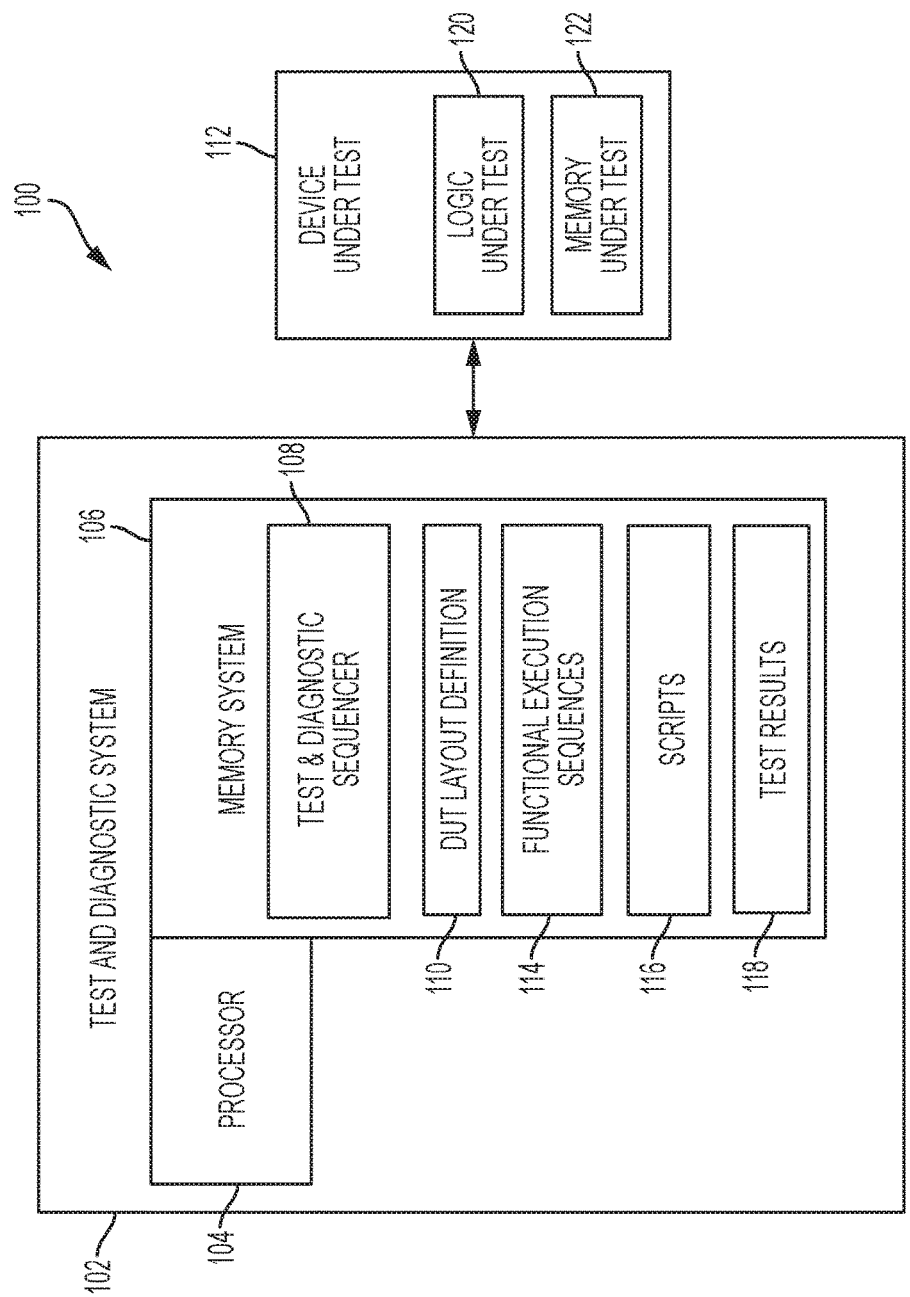
FIG. 1 illustrates a system in accordance with an embodiment.

The diagrams depicted herein are illustrative. There can be many variations to the diagram or the operations described therein without departing from the spirit of the invention. For instance, the actions can be performed in a differing order or actions can be added, deleted, or modified. Also the term "coupled", and variations thereof, describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect and the present invention is not intended to be limiting in this respect. Accordingly, a coupling of entities can refer to either a direct or an indirect coupling and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, a process, a method, an article, or an apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof are intended to include the degree of error associated with measurement of the particular quantity based upon the equipment available at the time of filing the application. For example, "about" can include a range of ±8%, 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, a problem often encountered during functional testing, power/performance optimization, and diagnosis of large and complex very-large-scale integration (VLSI) devices is in pinpointing the root cause of the fails. These fails can result from design marginality, processing defects, test setup, or combinations of all three. What generally aggravates this problem is that functional testing is based on a multitude of diverse and proportionally very long test sequences of architecture verification patterns (AVP). These AVP pattern exercisers are usually developed by the device design team to test a specific unit functionality and require special and unique skills to diagnose the failure.

Current functional diagnostic methods consist of interrogating the status of the error indicators, such as check-sums, parity errors, and specific status registers, after the functional exerciser fails. This process is then interactively repeated by altering the execution sequence and observing the state of the device until the problem has been diagnosed. This results in AVP fails that take a long time, are difficult to diagnose, and cannot be easily automated. The above functional diagnostic methodology, although effective in many instances, is inefficient, tedious and requires special design expertise as compared to structural design based diagnostic methodology. The structural diagnostic methodology is independent of the functionality of the device and is mostly based on fault modeled analysis. AVPs contain a stream of instructions, but what is missing is a method to create checkpoints along the way. Furthermore, once the fail is narrowed down to a section of the AVP, still missing is a way to effectively diagnose the source of the fail.

Turning now to an overview of the aspects of the invention, one or more embodiments of the invention address the above-described shortcomings of the prior art by providing a method for system functional test diagnostics by utilizing dynamic clock switching to identify the failing cycle count (e.g., via binary search) during the functional exerciser test. The method may be based on the structural design for test (DFT) support to dynamically select one or more functional clocks and modify the start, stop, and restart of the functional execution on a cycle-to-cycle basis while searching for the passing and failing ranges. In particular, in some embodiments of the present invention the method includes executing functional exercisers or tests up to one or more breakpoints and then applying dynamic clock switching via DFT support and built-in diagnostic features to isolate the cause of the fail. The diagnostic process can then be iteratively invoked for multiple break points by restarting or continuing the functional execution sequence to the next break point.

The above-described aspects of the invention address the shortcomings of the prior art by requiring minimal special design knowledge and skills to isolate and localize the source of the fail. The methodology is extendable to automated functional diagnostics and can be used to identify which part of the logic is sensitive to a particular environmental condition. The methodology can be used at speed functional testing and diagnosis and can be used with design verification tools such as Cronus for example. The methodology can detect single or multiple fails and can be used with characterization tools such as Shmoo. The methodology may be extendable from chip to system to field (e.g. E2E diagnostics). The binary search performed by the methodology can be automated and executed by an internal test support processor. The methodology can also be used to enhance and tune timing performance during characterization, such as by finding critical paths and adjusting local timing parameters. An additional benefit is that the methodology is easily integrated into current BIST designs at all system levels and test sectors, such as for example, from wafer to system in the field. The methodology can be further expanded to higher level package for system diagnostic self-repair. The methodology described herein can be used to identify various kinds of potential circuit defects, such as for example alternating current (AC) power defects. The AC defect may be detected by bouncing between a "good" and "failing" timing set while executing functional or structural patterns. The methodology can also be used for structural and LSSD testing patterns as well as used to isolate critical paths, switching noise, and other integrated circuit issues.

Turning now to FIG. 1, a block diagram of an example, non-limiting system 100 that can be used to implement one or more embodiments of the present invention. In this example, system 100 includes a test and diagnostic system 102 and a device under test 112. The test and diagnostic system 102 may be used as part of an integrated circuit (IC) development system configured to incorporate an integrated circuit layout into a device under test (DUT) 112 and verify/troubleshoot the operation of the DUT 112. For example, the DUT 112 may be fabricated as an IC chip, and the test and diagnostic system 102 identifies failures in the DUT 112 and identifies one or more likely causes of failures in the DUT 112. The DUT 112 can be distributed by the fabricator in raw wafer form (that is, as a single wafer that has multiple unpackaged chips), as a bare die, or in a packaged form. In the latter case, the DUT 112 can be mounted in a single chip package (such as a plastic carrier, with leads that are affixed to a motherboard or other higher level carrier) or in a multichip package (such as a ceramic carrier that has either or both surface interconnections or buried interconnections). The DUT 112 may also be integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In some embodiments of the present invention, test and diagnostic system 102 includes a processor 104 and a memory system 106. The processor 104 can be any type of processing circuitry and/or microcontroller, including multiple instances thereof, that is configurable to execute processes further described herein, where the memory system 106 is an example of a tangible storage medium. The memory system 106 can include a test and diagnostic sequencer 108, a DUT layout definition 110, one or more functional execution sequences 114, scripts 116, and test results 118. In some embodiments of the present invention, the processor 104 is coupled to the memory system 106, and the processor 104 is configured to execute the test and diagnostic sequencer 108, to execute one or more portions of the functional execution sequences 114 on the DUT 112, to verify operation, and diagnose a cause of one or more failure of logic under test 120 and/or memory under test 122 of the DUT 112. In some embodiments of the present invention, the scripts 116 can be used to select portions of the functional execution sequences 114 to run and to support a searching process to isolate the cause of a failure in combination with the DUT layout definition 110. Failure information can be captured in the test results 118 to indicate a likely failure cause in the DUT 112 as referenced against the DUT layout definition 110.

The logic under test 120 in the DUT 112 can include various logic circuits with latches and logic blocks (e.g., logic gates) organized to implement a particular function, such as an arithmetic logic unit, a decoding unit, an instruction fetch unit, and other such functional blocks that may be present in a processor or other type of integrated circuit. The memory under test 122 can be within the DUT 112 and/or otherwise accessible by the DUT 112, such as internal memory, cache memory, main memory, and the like.

The functional execution sequences 114 can include a sequence of instructions that invoke a sequence of operations on either or both of the logic under test 120 and/or the memory under test 122. Failures may not be readily identified immediately upon occurrence but may be identified after a sequence of multiple operations are performed. Moreover, in some embodiments of the present invention, a failure may be one or more of various suitable failure types (e.g., a system fail, a checkpoint fail, a multi-input signature register (MISR) fail, a parity fail, etc.).

Some embodiments of the present invention use a sequence of checkpoints and selectively re-execute different sized portions of the functional execution sequences 114 by utilizing dynamic clock switching to identify the failing cycle count (e.g., via binary search) during the functional exerciser test. The methodology may be based on structural DFT support to dynamically select one or more functional clocks and modify the start, stop, and restart of the functional execution on a cycle-to-cycle basis while searching for the passing and failing ranges. For example, in some embodiments of the present invention, the method includes executing functional exercisers or tests up to one or more breakpoints and then applying dynamic clock switching via DFT support and built-in diagnostic features to isolate the cause of the fail. The diagnostic process can then be iteratively invoked for multiple break points.

In some embodiments of the present invention, DFT support includes a start and stop cycle counter/register for cycle modification of a range. In some embodiments of the present invention, DFT support includes a start counter/register and a clock cycle counter. For example, in some embodiments of the present invention, the clock cycle uses a linear feedback shift register (LFSR) as a counter. In some embodiments of the present invention, DFT support includes support for cycle width and duty cycle modification or rate modification. In some embodiments of the present invention, DFT support includes resonance consideration support and/or start and stop phase synchronization. In some embodiments of the present invention, DFT support includes a phase alignment function. In some embodiments of the present invention, DFT support includes multiple diagnostic modes of operation, for example, a pass-to-fail mode and/or a fail-to-pass mode. In some embodiments of the present invention, DFT support includes support for isolation of a failing cycle or failing/passing cycle ranges. In some embodiments of the present invention, DFT support includes support for multiple time domains. In some embodiments of the present invention, DFT support includes support for the use of an alternate rate and duty cycle to be used concurrently. In some embodiments of the present invention, DFT support includes support for multiple passes at an alternate rate and duty cycle.

Figure 2:
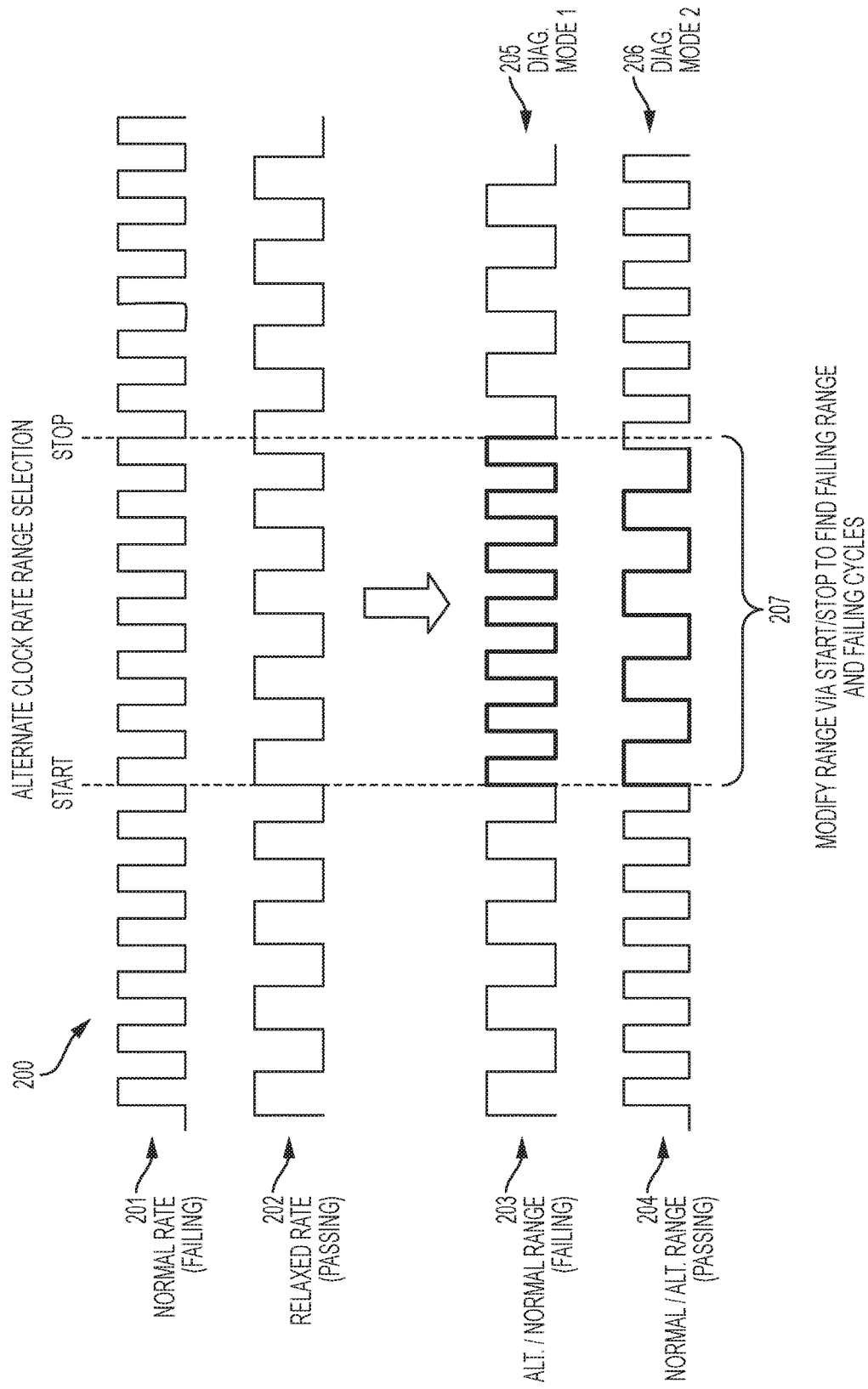
FIG. 2 illustrates an example timing overview of an alternate clock rate selection function that implements dynamic clock switching in accordance with one or more embodiments of the present invention.

FIG. 2 illustrates an example timing overview of an alternate clock rate selection function 200 that implements dynamic clock switching. In FIG. 2, a normal clock rate or frequency 201 is shown that has been set or detected to cause a device under test (e.g., DUT 112) to fail the functional test. An alternate clock rate 202 is also shown, which has been set or detected to cause the device under test to pass the functional test. In some embodiments of the present invention, the alternate clock rate 202 is a relaxed version of the normal clock rate 201 (e.g., period increase). Two composite signals are shown 203 and 204, in which the composite signals 203 and 204 are generated by alternating between the alternative clock signal 202 and a normal clock signal 201 for passing versus failing clock rate regions while executing the portion of the functional execution sequence to isolate a functional fail cycle or fail cycle range.

In one or more embodiments of the present invention, only one of the two composite signals is generated. The selection of which composite signal to generate may be set based on a diagnostic mode parameter that sets the diagnostic mode 205 and 206. Composite signal 203 demonstrates a composite signal that is generated for a first diagnostic mode 205 by utilizing the alternate clock signal 202 except between a subset of cycles 207 (e.g., start-to-stop cycle). For composite signal 203, the clock rate for the subset of cycles 207 is the clock rate produced by the normal clock signal 201. Composite signal 204 demonstrates a composite signal that is generated for a second diagnostic mode 206 by utilizing the normal clock signal 201 except between a subset of cycles 207 (e.g., start-to-stop cycle). For composite signal 204, the clock rate for the subset of cycles 207 is the clock rate produced by the alternate clock signal 202. In other words, the composite signals 203 and 204 allow for the clock rate or duty cycle as seen by the device under test 112 to be controlled for a range of test cycles by switching dynamically between a "good" timing set and a "failing" timing set while executing functional or structural patterns. The good timing set may be a relaxed version of the failing timing set. The failing timing set may be the clock rate that was being utilized when a functional test was detected as failing. As will be discussed in further detail below, the subset of cycles 207 is defined by a start-stop region that is dynamically modified during a binary or linear search for a failing cycle or failing cycle range.

Figure 3:
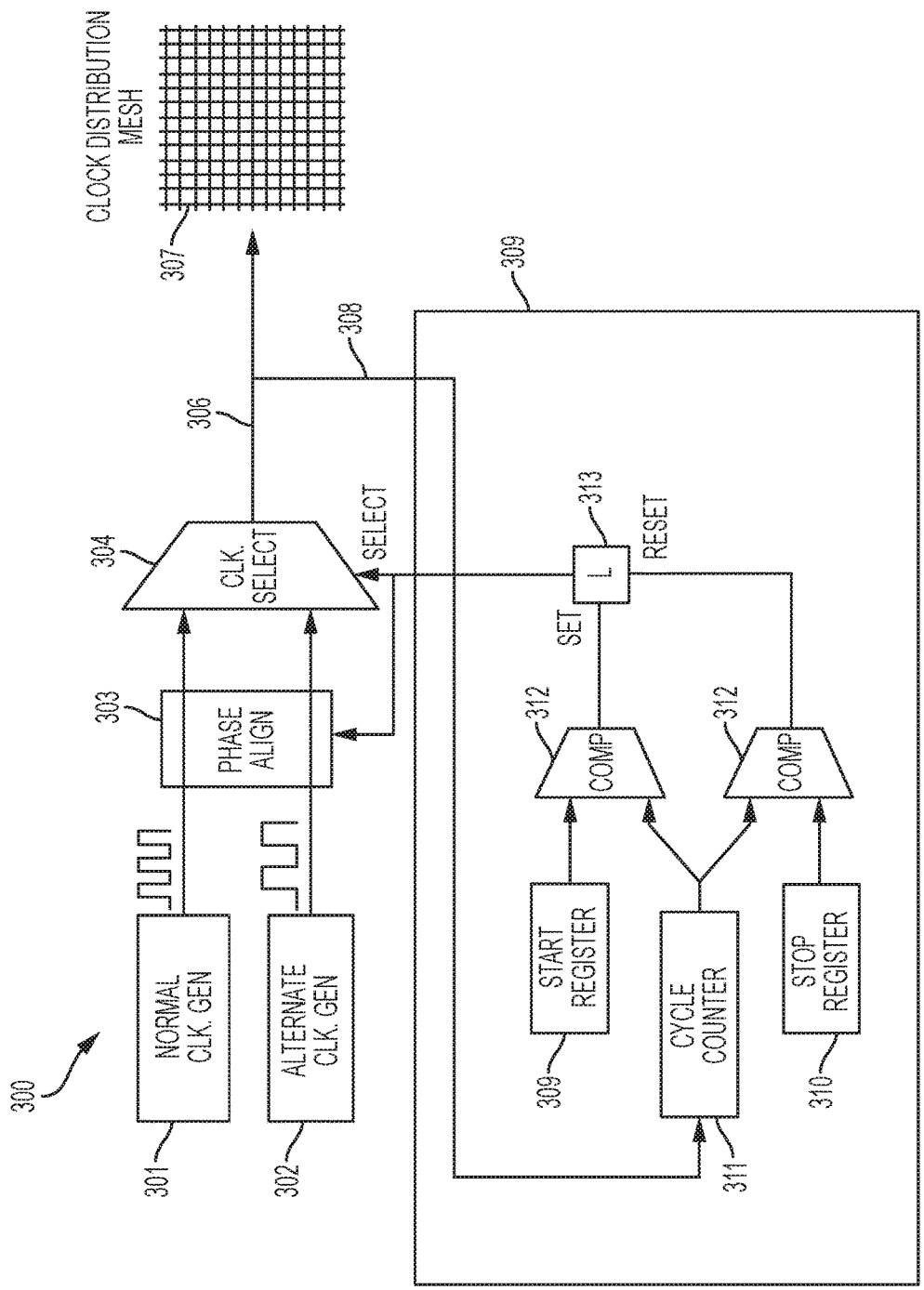
FIG. 3 illustrates an example of a test and diagnostic that performs dynamic clock switching via alternate clock selection in accordance with one or more embodiments of the present invention.

FIG. 3 illustrates an example of a test and diagnostic system 300 as an embodiment of the test and diagnostic system 102 of FIG. 1 to perform dynamic clock switching via alternate clock selection 200 of FIG. 2. The test and diagnostic system 300 includes a normal clock signal generator 301, an alternate clock signal generator 302, a phase alignment function 303, a clock signal selector multiplexer 304, and a cycle range clock selection function 305.

The normal clock signal generator 301 is configured to generate a functional clock signal having a rate that causes the device under test to fail the function execution sequence. In some embodiments of the present invention, the functional clock signal is generated by the normal clock signal generator 301 when the test and diagnostic system 300 is in a functional mode. In some embodiments of the present invention, the functional clock signal generated by the normal clock signal generator 301 is based at least in part on phase locked loop (PLL) circuitry, such as for example digital phase locked loop (DPLL) circuitry. The use of PPL based circuitry may be particularly useful in implementations where the cycle time of clocks cannot be controlled externally. In some embodiments that include PLL circuitry, the PLL circuitry itself is not modified but rather the time produced from an output of the PLL circuitry is modified. In some embodiments of the present invention, two PLLs can be used, in which one is faster than the other. In some embodiments, one PLL may be used, in which the PLL has two possible outputs, each with a different rate or frequency.

The alternate clock signal generator 302 is configured to generate a functional clock signal having a rate or frequency that causes the device under test to pass the function execution sequence. In some embodiments of the present invention, the functional clock signal is generated by the alternate clock signal generator 302 when the test and diagnostic system 300 is in a diagnostics or characterization mode.

The phase alignment function 303 is configured to align the phases of the functional clock signals generated by the normal clock signal generator 301 and the alternate clock signal generator 302 during clock switching to prevent transition errors The clock signal selector multiplexer 304 is configured to switch between the normal clock signal generated by the normal clock signal generator 301 and the alternate clock signal generated by the alternate clock signal generator 302 and to output a composite clock signal 306 that is applied to the device under test. A clock distribution mesh 307 is depicted in FIG. 3 shows an example clock distribution for the device clock of the device under test.

In some embodiments of the present invention, switching between the generated normal clock signal and the generated alternate clock signal includes utilizing a normal clock signal before a selected cycle range (e.g., sub cycles 207), switching to an alternate clock signal during the selected cycle range (e.g., sub cycles 207), and then switching back to the normal clock signal after the selected cycle range (e.g., sub cycles 207). In some embodiments of the present invention, switching between the generated normal clock signal and the generated alternate clock signal includes utilizing an alternate clock signal before a selected cycle range (e.g., sub cycles 207), switching to a normal clock signal during the selected cycle range (e.g., sub cycles 207), and then switching back to the alternate clock signal after the selected cycle range (e.g., sub cycles 207).

In some embodiments of the present invention, the cycle range clock section function 305 is configured to receive the composite clock signal 306 as feedback 308 to generate a clock range selection signal. In some embodiments of the present invention, the clock range selection signal may be a binary signal that is set to high or low between a start and stop range such that the clock signal selector multiplexer 304 switches between signals at the starting point and stopping point of the start and stop range (e.g., sub cycles 207).

In some embodiments of the present invention, the cycle range clock selection function 305 includes a start register 309, a stop register 310, a cycle counter 311, a pair of comparators 312, and a latch 313. The start register 309 is a register that indicates a starting cycle to be used for the start and stop range. The stop register 310 is a register that indicates a stopping cycle to be used for the start and stop range. The cycle counter 311 keeps track of the number of cycles of the generated composite clock signal 306. The comparators 312 generate set/reset range selection signals that are held by latch 313 for selecting the start and stop range.

Figure 4:
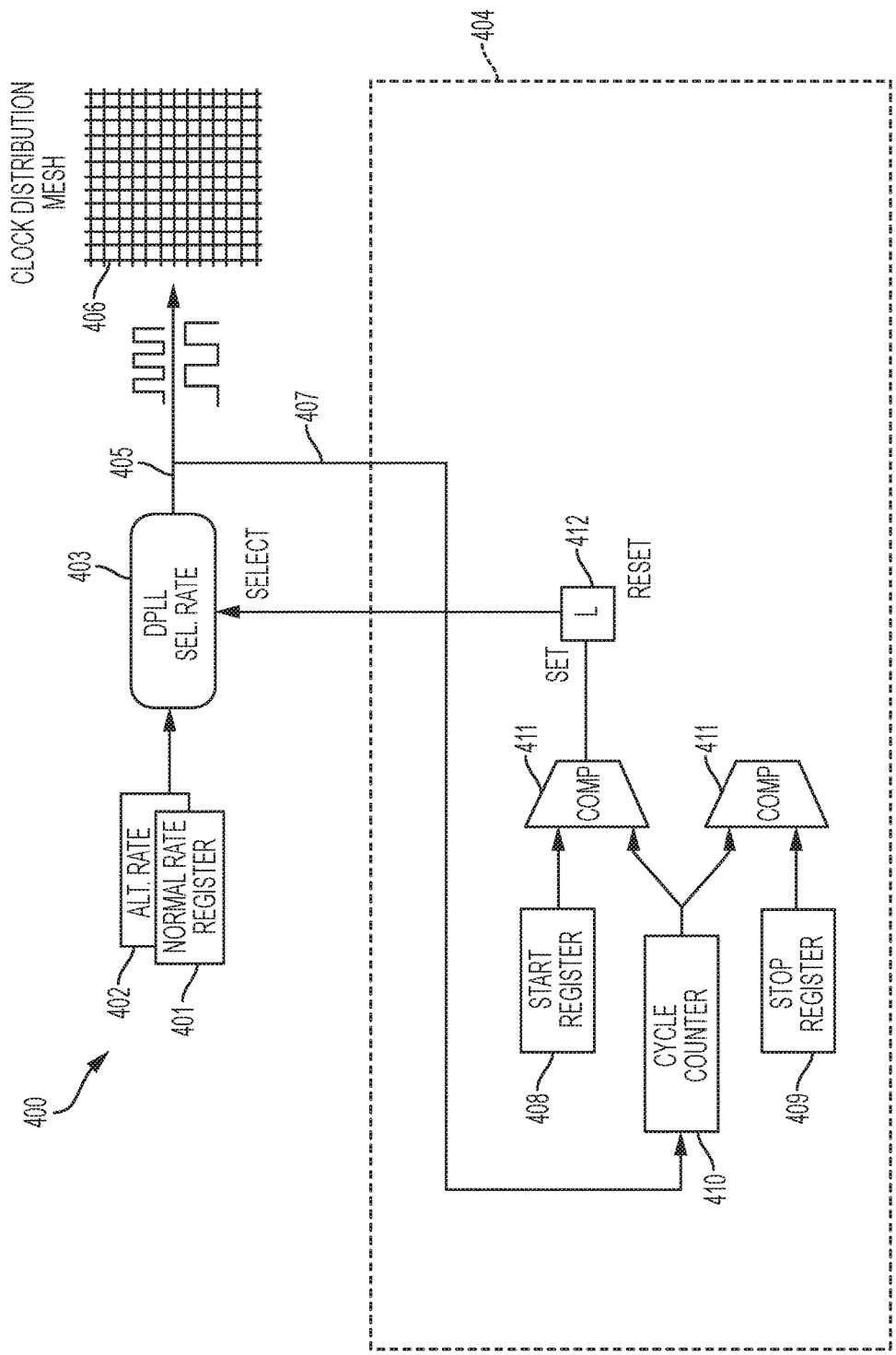
FIG. 4 illustrates an example of a test and diagnostic that performs dynamic clock switching via DPLL based alternate clock generation in accordance with one or more embodiments of the present invention.

FIG. 4 illustrates an example of a test and diagnostic system 400 as an embodiment of the test and diagnostic system 102 of FIG. 1 to perform dynamic click switching via DPLL based alternate clock generation of FIG. 3. The test and diagnostic system 400 includes a normal clock rate register 401, an alternate clock rate register 402, a programmable DPLL signal rate selector 403, and a cycle range clock selection function 404.

The normal clock rate register 401 is configured to hold a DPLL setup register for normal clock rate generation by the programmable DPLL signal rate selector 403. The alternate clock rate register 402 is configured to hold a DPLL setup register for alternate clock rate generation by the programmable DPLL signal rate selector 403.

In some embodiments of the present invention, normal clock rate generation includes generating by the programmable DPLL signal rate selector 403 a functional clock signal having a rate or frequency set by the normal clock rate register 401, in which the rate causes the device under test to fail the function execution sequence. In some embodiments of the present invention, the functional clock signal is generated by the programmable DPLL signal rate selector 403 when the test and diagnostic system 400 is in a functional mode.

In some embodiments of the present invention, alternate clock rate generation includes generating by the programmable DPLL signal rate selector 403 a functional clock signal having a rate or frequency set by the normal clock rate register 401, in which the rate causes the device under test to pass the function execution sequence. In some embodiments of the present invention, the functional clock signal is generated by the programmable DPLL signal rate selector 403 when the test and diagnostic system 400 is in a diagnostics or characterization mode.

The programmable DPLL signal rate selector 403 is configured to switch between generating a normal clock signal and an alternate clock signal to output a composite clock signal 405 that is applied to the device under test. A clock distribution mesh 406 is depicted in FIG. 4 showing an example clock distribution of the device clock of the device under test.

In some embodiments of the present invention, switching between generating a normal clock signal and an alternate clock signal to output a composite clock signal includes generating a normal clock signal before a selected cycle range (e.g., sub cycles 207), generating an alternate clock signal during the selected cycle range (e.g., sub cycles 207), and then generating the normal clock signal after the selected cycle range (e.g., sub cycles 207). In some embodiments of the present invention, switching between generating a normal clock signal and an alternate clock signal to output a composite clock signal includes generating an alternate clock signal before a selected cycle range (e.g., sub cycles 207), generating a normal clock signal during the selected cycle range (e.g., sub cycles 207), and then generating the alternate clock signal after the selected cycle range (e.g., sub cycles 207).

In some embodiments of the present invention, the cycle range clock section function 404 is configured to receive the composite clock signal 405 as feedback 407 to generate a clock range selection signal. In some embodiments of the present invention, the clock range selection signal may be a binary signal that is set to high or low between a start and stop range such that the programmable DPLL signal rate selector 403 switches between signals at the starting point and stopping point of the start and stop range (e.g., sub cycles 207).

In some embodiments of the present invention, the cycle range clock selection function 404 includes a start register 408, a stop register 409, a cycle counter 410, a pair of comparators 411, and a latch 412. The start register 408 indicates a starting cycle to be used for the start and stop range. The stop register 409 is a register that indicates a stopping cycle to be used for the start and stop range. The cycle counter 410 keeps track of the number of cycles of the generated composite clock signal 405. The comparators 411 generate set/reset range selection signals that are held by latch 412 for selecting the start and stop range.

Figure 5:
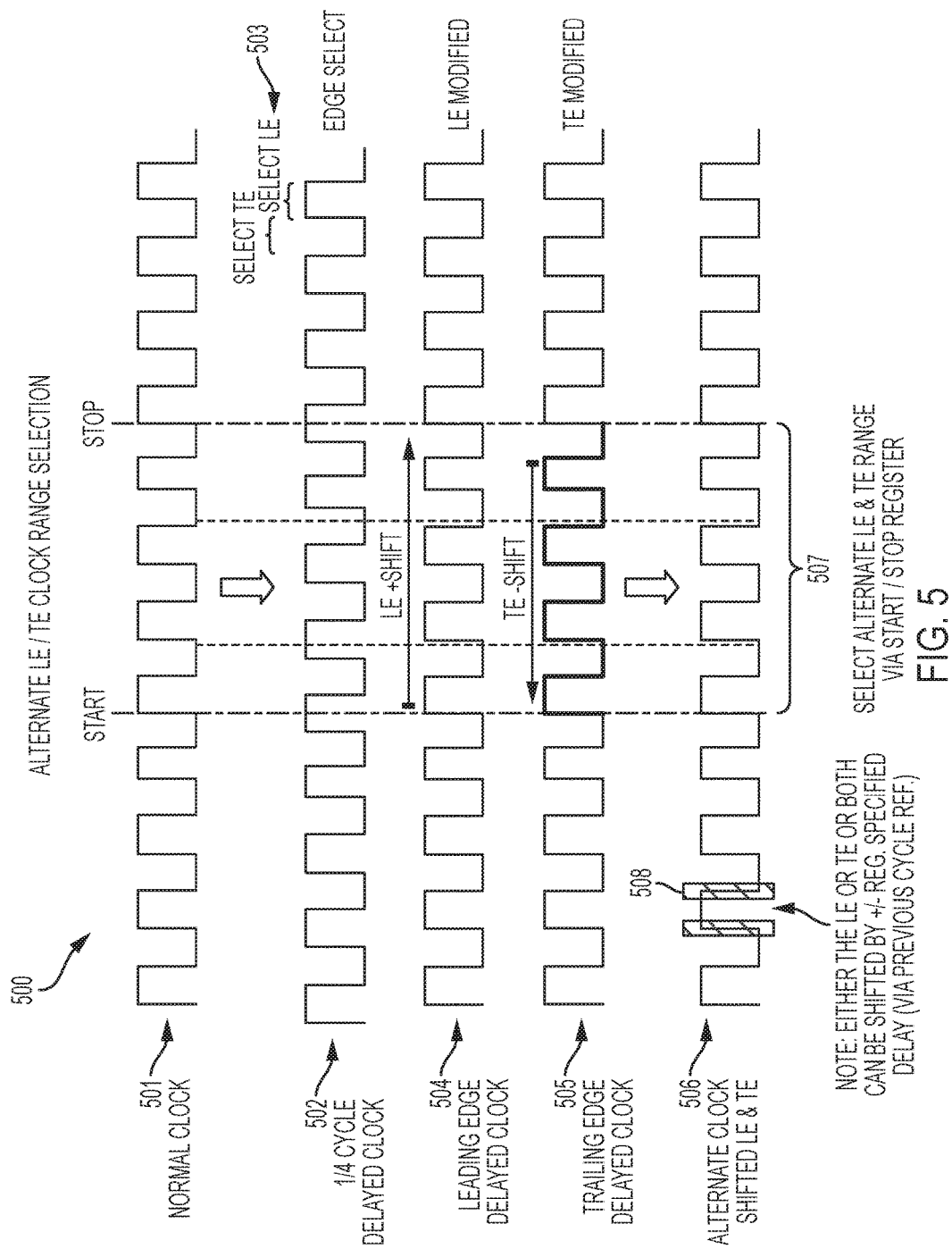
FIG. 5 illustrates an example timing overview of a variable leading (LE) edge and trailing edge (TE) signal generation function 500 that implements dynamic clock switching via modification of a normal clock signal in accordance with one or more embodiments of the present invention.

FIG. 5 illustrates an example timing overview of a variable LE and TE signal generation function 500 that implements dynamic clock switching via the modification of a normal clock signal. In FIG. 5, a normal clock signal 501 is shown that has a rate or frequency set or detected to cause the device under test to fail a functional test. A delayed clock signal 502 is shown that comprises a shifted or delayed version of the normal clock signal 501, in which the delayed clock signal 502 is delayed by a given cycle amount (e.g., ¼ cycle delay) to assist in selecting between the LE and the TE of the normal clock signal 501. Element 503 shows the edge selection signal of the delayed clock signal 502. An LE delayed clock signal 504 is shown that comprises a version of the normal clock signal 501 in which the period of the normal clock signal 501 is shifted by the LE between a specified start and stop cycle range 507. A TE delayed clock signal 505 is shown that comprises a version of the normal clock signal 501 in which the period of the normal clock signal 501 is shifted by a TE between a specified start and stop cycle range 507. A composite alternate clock signal 506 is shown that comprises a version of the normal clock signal 501, in which the period of the normal clock signal 501 is shifted by either the LE, TE, or both the LE and TE by a specified delay between the specified start and stop cycle range 507. The shaded areas denoted as element 508 represents the extent of the edge shift that occurs between the start and stop range 507. As will be described in further detail below, the start and stop range 507 can be initially set in accordance with a start and stop register. In some embodiments of the present invention, the composite alternate clock signal 506 is generated by modifying an LE, TE, or both a LE and TE of a normal clock signal, in which modification includes switching dynamically between a variable LE delay of the normal clock signal and a variable TE delay of the normal clock signal.

Figure 6:
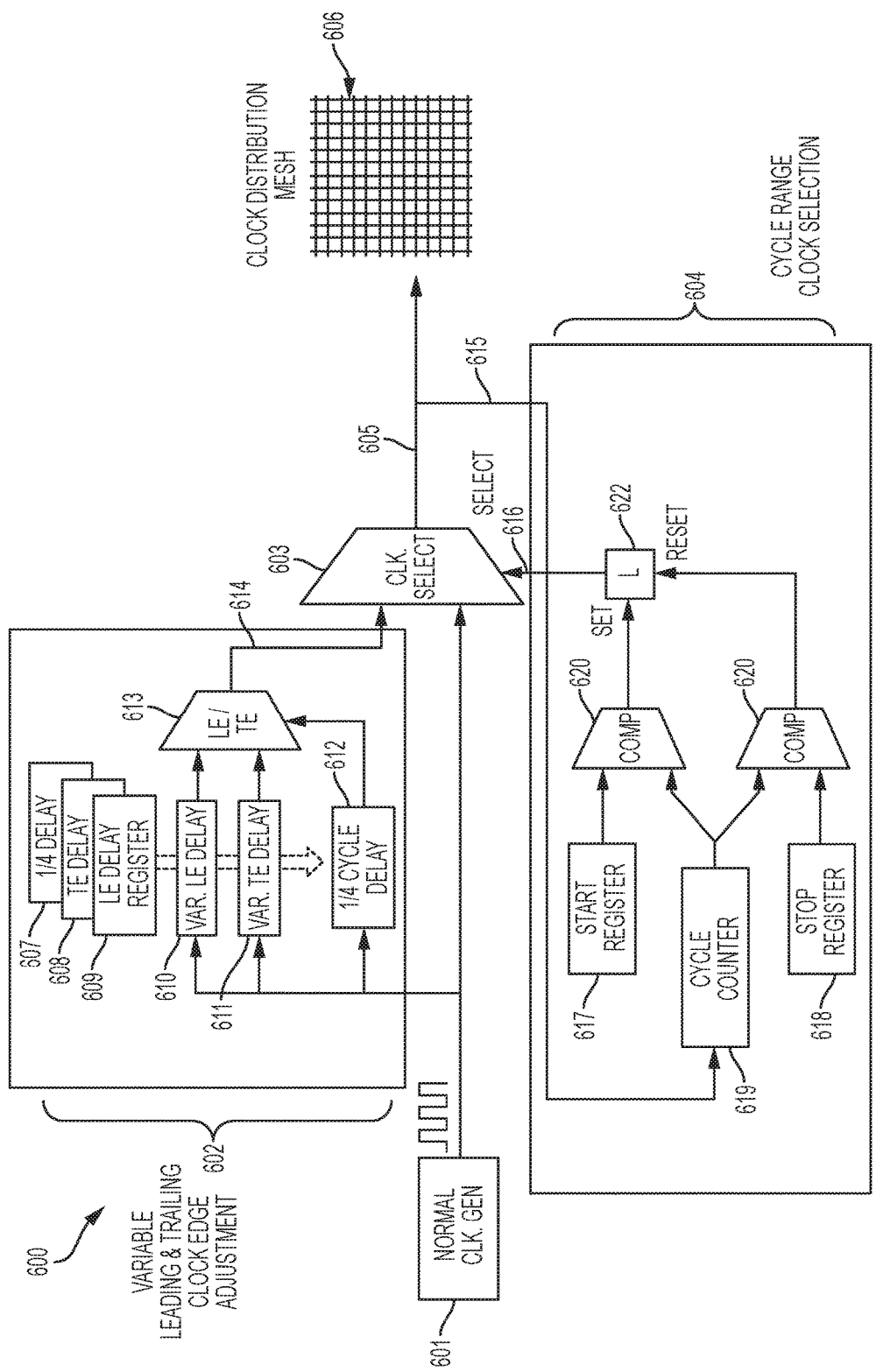
FIG. 6 illustrates an example of a test and diagnostic that performs dynamic clock switching via variable LE edge and TE signal generation in accordance with one or more embodiments of the present invention.

FIG. 6 illustrates an example of a test and diagnostic system 600 as an embodiment of the test and diagnostic system 102 of FIG. 1 to perform dynamic clock switching via variable LE and TE signal generation 500 of FIG. 5. The test and diagnostic system 600 includes a normal clock signal generator 601, a variable clock leading and TE adjustment function 602, a clock signal selector multiplexer 603, and a cycle range clock selection function 604.

The normal clock signal generator 601 is configured to generate a functional clock signal having a rate that causes the device under test to fail the function execution sequence. In some embodiments of the present invention, the functional clock signal is generated by the normal clock signal generator 601 when the test and diagnostic system 600 is in a functional mode. In some embodiments of the present invention, the functional clock signal generated by the normal clock signal generator 601 is based at least in part on PLL circuitry.

The variable clock leading and TE adjustment function 602 is configured to generate from the normal clock signal an alternate functional clock signal having a rate or frequency that causes the device under test to pass the function execution sequence. In some embodiments of the present invention, the alternate functional clock signal is generated by the variable clock leading and TE adjustment function 602 when the test and diagnostic system 600 is in a diagnostics or characterization mode.

In some embodiments of the present invention, variable clock leading and TE adjustment function 602 includes a cycle delay register 607, a TE delay register 608, an LE delay register 609, a variable LE delay function 610, a variable TE delay function 611, a cycle delay function 612, and a modified LE or TE selection multiplexer 613. The cycle delay register 607 indicates a delay to be used by the cycle delay function 612 when generating a delayed clock signal from the normal clock signal. For example, in some embodiments of the present invention, the delay register indicates a ¼ cycle delay, which is used by the cycle delay function 612 to generate a version of the normal clock signal with a ¼ cycle delay. The LE delay register 609 indicates an initial leading edge delay to be used by variable LE delay function 610. The TE delay register 608 indicates an initial a TE delay to be used by variable TE delay function 611.

In some embodiments of the present invention, the variable LE delay function 610 modifies the normal clock signal generated by the normal clock signal generator 601 by shifting an LE of the normal clock signal for a specified start and stop range. The variable TE delay function 611 modifies the normal clock signal generated by the normal clock signal generator 601 by shifting a TE of the normal clock signal for the specified start and stop range.

In some embodiments of the present invention, the modified LE or TE selection multiplexer 613 switches between an output of the variable LE delay function 610 and an output of the variable TE delay function 611 in response to the cycle delay signal generated by the cycle delay function 612. The output of the modified LE or TE selection multiplexer 613 is a modified LE and/or TE clock signal 614 that is used as an input by the clock signal selector multiplexer 603.

The clock signal selector multiplexer 603 is configured to switch between the normal clock signal generated by the normal clock signal generator 601 and the modified LE and/or TE clock signal 614, and to output a composite clock signal 605 that is applied to the device under test. A clock distribution mesh 606 is depicted in FIG. 6 showing an example of a clock distribution for the device clock of the device under test.

In some embodiments of the present invention, switching between the generated normal clock signal and the modified LE and/or TE clock signal 614 includes utilizing the normal clock signal before a selected cycle range (e.g., sub cycles 507), switching to the modified LE and/or TE clock signal 614 during the selected cycle range (e.g., sub cycles 507), and then switching back to the normal clock signal after the selected cycle range (e.g., sub cycles 507). In some embodiments of the present invention, switching between the generated normal clock signal and the generated alternate clock signal includes utilizing the modified LE and/or TE clock signal 614 before a selected cycle range (e.g., sub cycles 507), switching to a normal clock signal during the selected cycle range (e.g., sub cycles 507), and then switching back to the modified LE and/or TE clock signal 614 after the selected cycle range (e.g., sub cycles 507).

In some embodiments of the present invention, the cycle range clock selection function 604 is configured to receive the composite clock signal 605 as feedback 615 to generate a clock range selection signal 616. In some embodiments of the present invention, the clock range selection signal 616 may be a binary signal that is set to high or low between a start and stop range such that the clock signal selector multiplexer 603 switches between signals at the starting point and stopping point of the start and stop range (e.g., sub cycles 507).

In some embodiments of the present invention, the cycle range clock selection function 604 includes a start register 617, a stop register 618, a cycle counter 619, a pair of comparators 620, and a latch 622. The start register 617 indicates a starting cycle to be used for the start and stop range. The stop register 618 is a register that indicates a stopping cycle to be used for the start and stop range. The cycle counter 619 keeps track of the number of cycles of the generated composite clock signal 605. The comparators 620 generate set/reset range selection signals that are held by latch 622 for generating a clock range selection signal 616.

Figure 7:
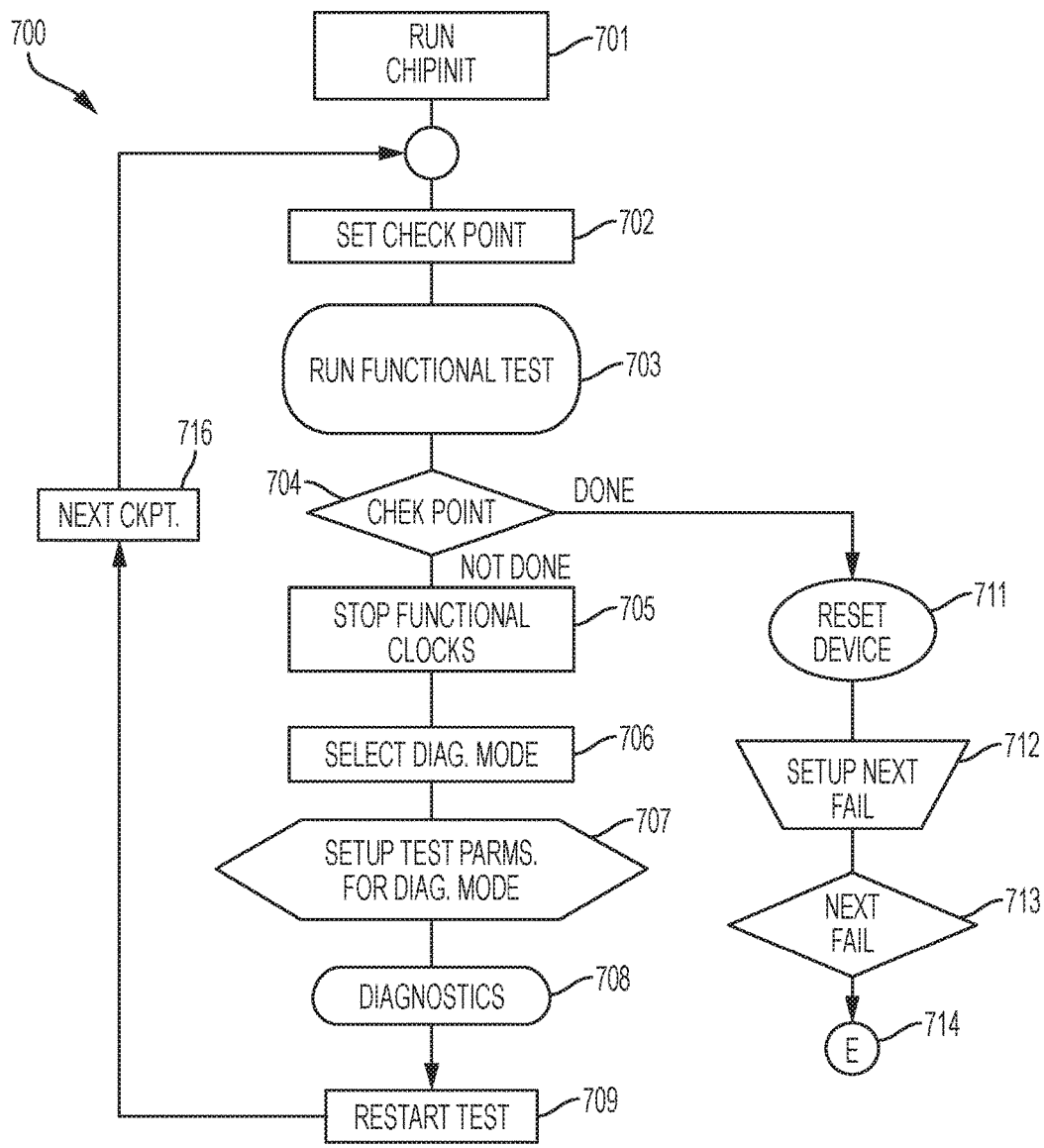
FIG. 7 illustrates an example of a function checkpoint test flow in accordance with one or more embodiments of the present invention.

FIG. 7 illustrates an example of a function checkpoint test flow 700 in accordance with an embodiment. At block 701, a chip initialization sequence is run to setup the DUT 112 of FIG. 1 in a functional mode. At block 702, one or more checkpoints are set. Additional checkpoints can be added dynamically. Checkpoints can be added at a clock stop count or at particular steps in an architectural verification pattern flow. At block 703, a functional test exerciser run begins, for instance, to execute an instruction sequence on the DUT 112 of FIG. 1 as defined by a portion of the functional execution sequences 114 covering one or more functional aspect of the logic under test 120 and/or memory under test 122 of FIG. 1.

Upon reaching a checkpoint at block 704, a check is performed to determine whether functional testing is done. At block 705, if functional testing is not done, functional clocks are stopped. At block 706, a desired diagnostic mode is selected (e.g., alternate rate or edge modify). At block 707, initial execution parameters of the function test and diagnostic mode are setup. At block 708, if dynamic diagnostics are enabled, a diagnostic sequence can be performed, such as the functional diagnostic process flow 800 of FIG. 8; otherwise, at block 709, testing is restarted or continued. At block 710, a next checkpoint is determined and set again at block 702.

If testing is done after the checkpoint of block 704, then exerciser testing is stopped and the device under test and diagnostic mode are reset at block 711. At block 712, the device under test is setup for next fail diagnostics, which can include setting and or modifying various registers (e.g., a start register, stop register, alternate rate register, normal rate register, clock delay register, TE delay register, and/or LE delay register). At block 713, results are checked to determine whether there is another fail to diagnose. At block 714, the functional exerciser test is stopped and any failing results can be further analyzed to progressively isolate one or more likely causes of the failure as a most likely failure source. Note that multiple interim signatures can be dumped for all checkpoints if required for off-line diagnostics.

Figure 8:
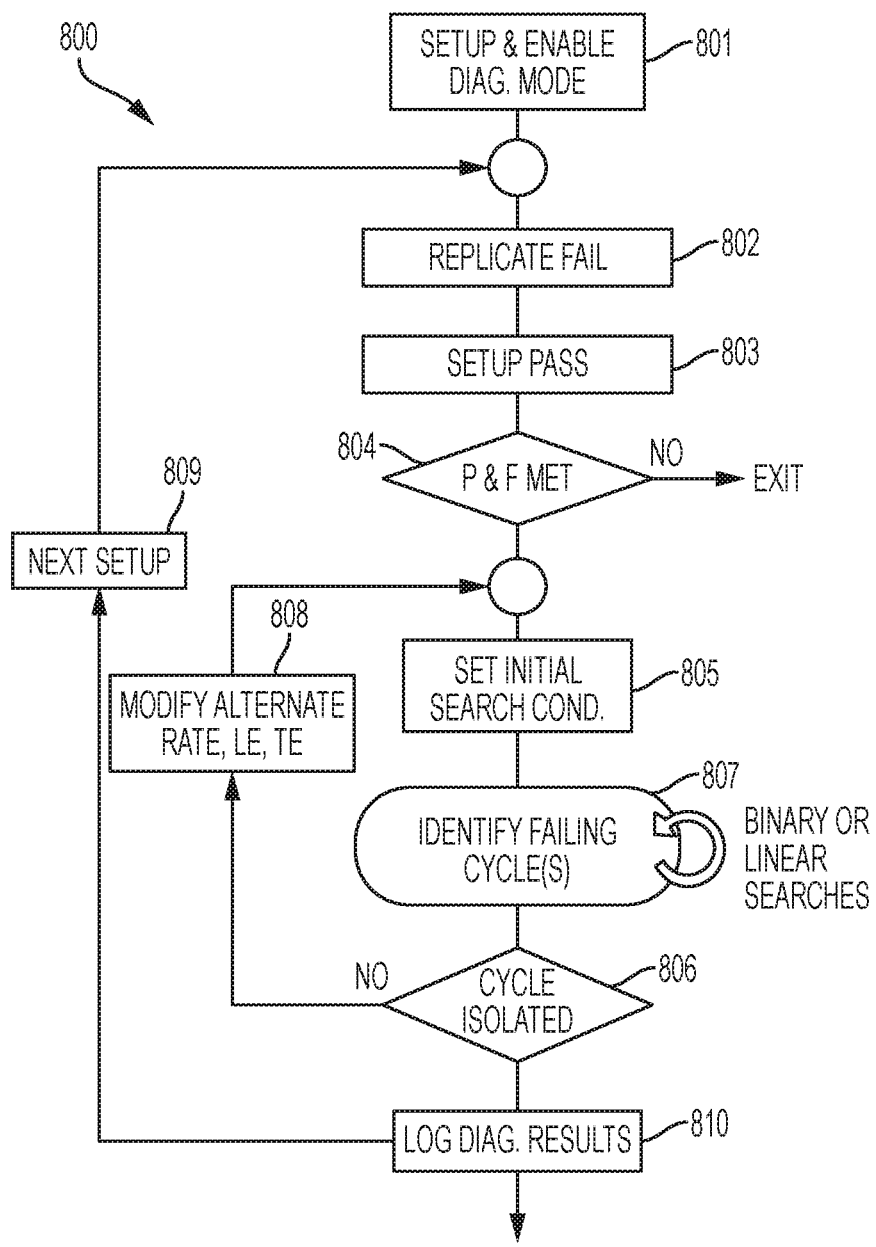
FIG. 8 illustrates an example of a functional diagnostic process flow in accordance with one or more embodiments of the present invention.

FIG. 8 illustrates a functional diagnostic process flow 800 in accordance with an embodiment. At block 801, diagnostic mode and associated parameters are setup and enabled. At block 802, a functional fail environment of the system is replicated. At block 803, passing conditions of the same test are setup as a good reference. At block 804, if a failure cannot be replicated or if the passing conditions cannot be setup, then flow exists. At block 805, initial search conditions are setup for a start and stop alternate range. At block 806, a check is performed to determine whether a desired cycle isolation has been achieved. If the desired cycle isolation has not been achieved, looping on test until a failing cycle is isolated 807. At block 808, the alternate clock diagnostic parameters are modified, such as the clock rate, LE, and TE. At block 809, initial conditions for the next fail to be diagnosed are setup. At block 810, diagnostic results are logged for analysis, for instance, in test results 118 of FIG. 1, and the flow returns to the test flow 700.

Figure 9:
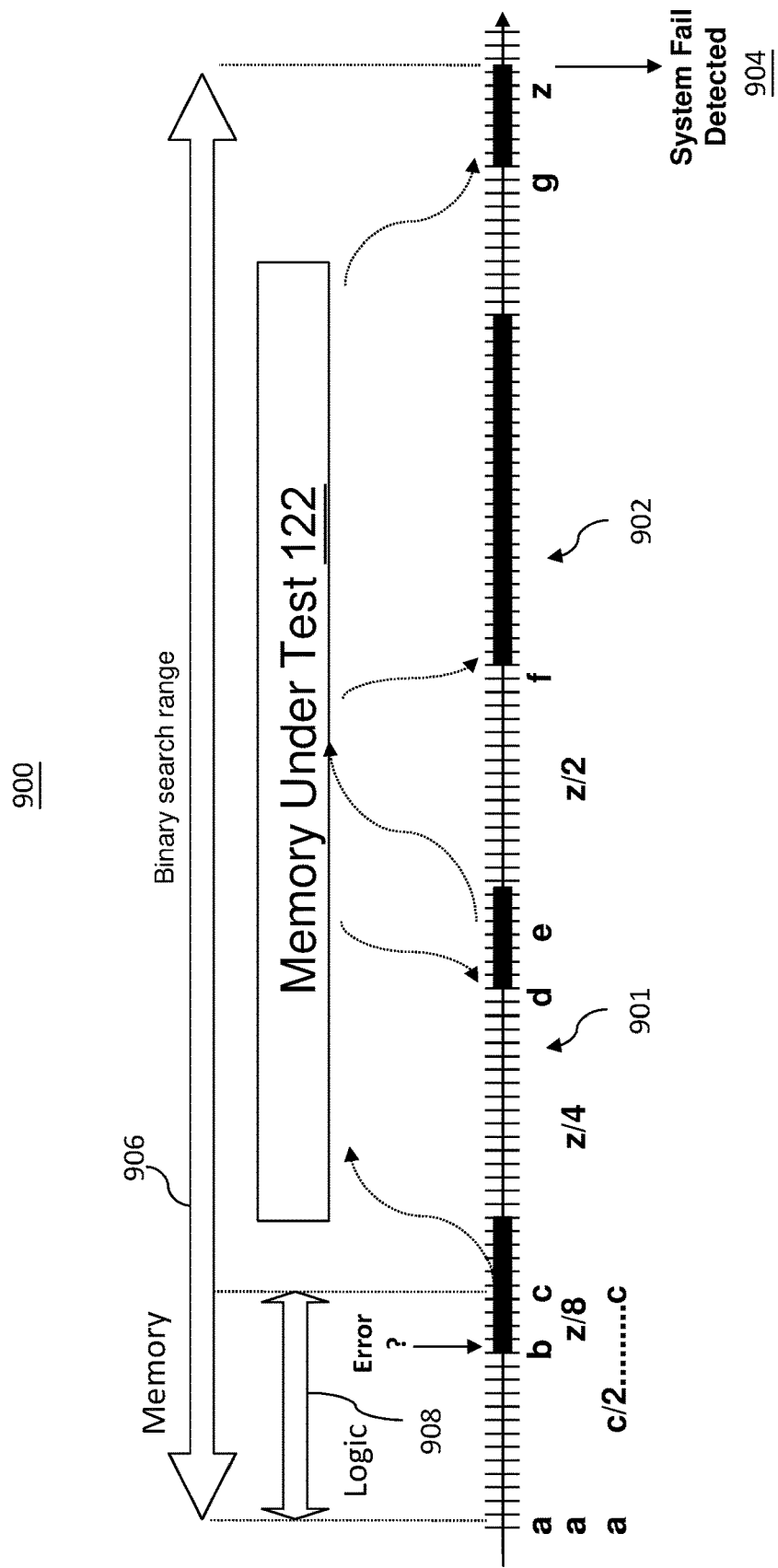
FIG. 9 illustrates an example of a functionally assisted diagnostic search sequence in accordance with one or more embodiments of the present invention.

FIG. 9 illustrates an example of a functionally assisted diagnostic search sequence 900 in accordance with one or more embodiments of the present invention. Embodiments can identify a variety of failure combinations and use various search algorithms to isolate a most likely failure source. Logic induced errors can be identified for the logic under test 120 where there are no memory errors detected but a failure is detected by system checkers. A memory induced error may be identified in the memory under test 122 where there are no logic errors and a failure is detected by system checkers.

For example, a functional execution sequence 902 (with associated failing cycles indicated as black bars on cycle timeline 901) can involve actions performed by logic under test 120 of FIG. 1 and interactions with memory under test 122. A system fail 904 can be detected after executing a number of instructions between checkpoints. Since a large number of operations may occur between checkpoints, one or more binary searches can be used to progressively analyze and eliminate portions of the functional execution sequence 902 until a most likely failure source is identified. For example, the functional execution sequence 902 can include operations between checkpoint-a and checkpoint-z. Upon a first fail cycle between a start and a binary search point range of checkpoints, latches and/or corresponding memory can be dumped for further diagnostic analysis. Although described as a binary search, other linear and/or hybrid search sequences can be used to optimize test time and the like.

In the example of FIG. 9, upon detection of system fail 904, a binary search for a memory input fail can be initially performed over a memory search range 906 between checkpoint-a and checkpoint-z to confirm whether the system fail 904 is detectable. The functional execution sequence 902 can be run again between checkpoint-a and cycle z/2 (between checkpoint-e and checkpoint-f) to determine whether the system fail 904 initially occurs in the first half or the second half of the functional execution sequence 902. The binary search process can continue by checking for a memory input fail between checkpoint-a and cycle z/4 (between checkpoint-c and checkpoint-d) and further between checkpoint-a and cycle z/8 (between checkpoint-b and checkpoint-c). If, for example, the system fail 904 is isolated as no fail up to checkpoint-c, then further searching can be performed from checkpoint-c up to the first memory fail cycle, indicating a failure of the memory under test 122.

If the system fail 904 is detected between checkpoint-a and checkpoint-c before accesses are made to the memory under test 122, a binary search over a logic range 908. In some embodiments of the present invention, an LBIST support system may be utilized by performing the search using logic STUMP MISRs. The binary search of logic range 908 can be performed by iteratively invoking a portion of the functional execution sequence 902 between checkpoint-a and cycle c/2 (between checkpoint-a and checkpoint-b). If the system fail 904 is not located between checkpoint-a and cycle c/2, further searching can be performed between checkpoint-a and cycle 3c/4. The searching can continue to progressively narrow the failure source down to a single cycle of the functional execution sequence 902 and thereby isolate a most likely failure source. The failure search may be accelerated by restarting the functional execution sequence 902 at a previously executed intermediate value without returning back to the starting cycle of checkpoint-a (e.g., restart at checkpoint-b, checkpoint-d, checkpoint-f, checkpoint-g, etc.).

Figure 10:
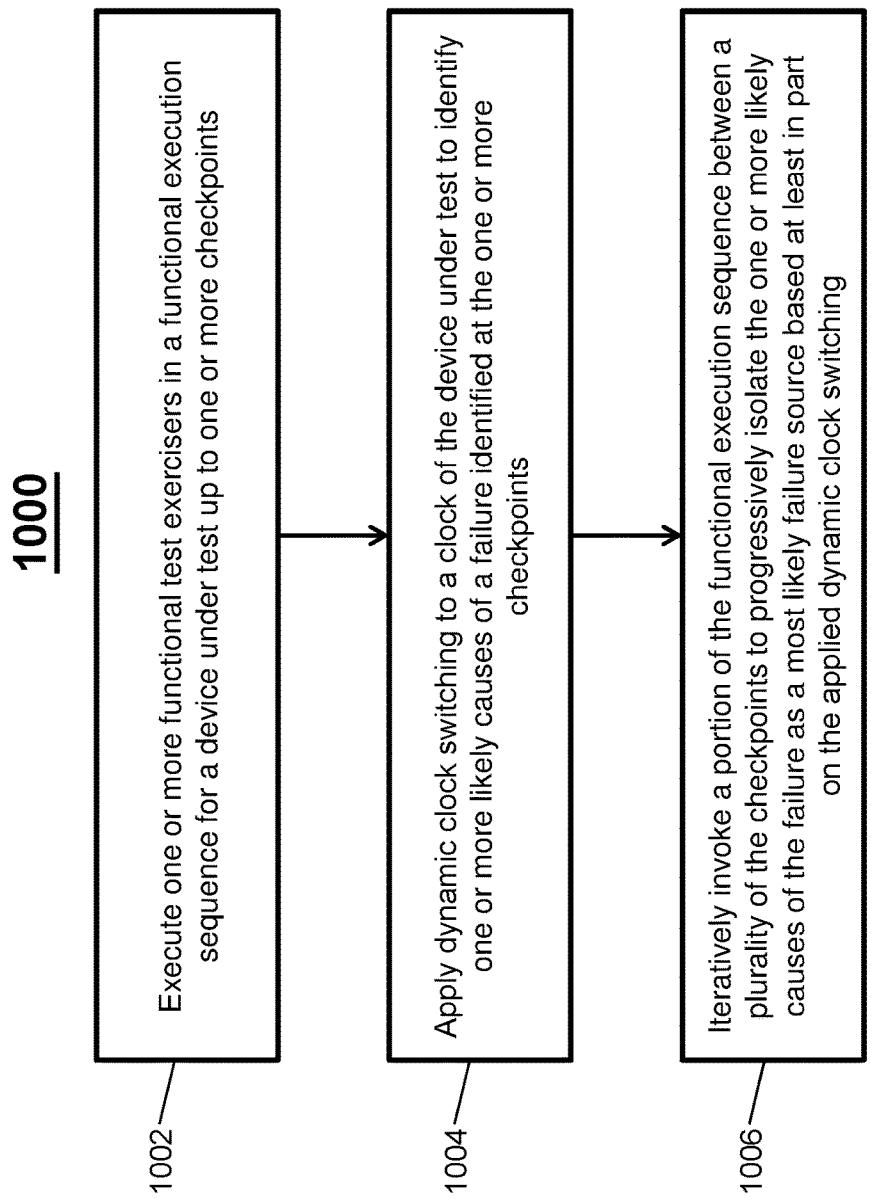
FIG. 10 illustrates an flow diagram of an example process for functional test and diagnostics for integrated circuits in accordance with one or more embodiments of the present invention.

Turning now to FIG. 10, a flow diagram of a process 1000 for functional test and diagnostics for integrated circuits is generally shown in accordance with an embodiment. The process 1000 is described with reference to FIGS. 1, 2, and 9 and may include additional steps beyond those depicted in FIG. 10.

At block 1002, one or more functional test exercisers are executed in a functional execution sequence for DUT 112 up to one or more checkpoints, such as functional execution sequence 1002 between checkpoint-a and checkpoint-z, where the functional execution sequence can be selected from functional execution sequences 114 to target particular portions of the logic under test 120 and/or memory under test 122. In some embodiments of the present invention, the logic under test 120 and/or memory under test 122 includes one or more signature registers (e.g., MISRs).

At block 1004, dynamic clock switching is applied to a clock of the device under test to identify one or more likely causes of a failure identified at the one or more checkpoints. This may be performed by, for example, utilizing one or more built-in test support circuits of the DUT 112 that applied to identify one or more likely causes of a failure identified at the one or more checkpoints, such as chain select via LBIST or via BIST patterns for example.

At block 1006, a portion of the functional execution sequence 902 is iteratively invoked between a plurality of the checkpoints to progressively isolate the one or more likely causes of the failure as a most likely failure source based at least in part on the applied dynamic clock switching. Results from the functional execution sequence may be originated from the device under test in a variety of different ways. For example, in some embodiments of the present invention the device under test may include one or more support circuits for instance. A plurality of cumulative results (e.g., signatures) from the one or more support circuits can be stored in one or more signature registers from a starting configuration of the one or more functional test exercisers to compare an end-point at one of the one or more checkpoints, where the cumulative results are indicative of a pass signature or a fail signature.

A binary search can be applied between the one or more checkpoints based on analyzing the at least one associated instance of the one or more signature registers for the logic under test 120 and the memory under test 122 to isolate the most likely failure source as a portion of the logic under test 120 or a portion of the memory under test 122. For example, a particular clock cycle or a range of clock cycles may be isolated that is associated with an instance of a particular fail. The range of failing clock cycles or the particular fail cycle may be ascertained based at least in part on the application of dynamic clock switching.

In some embodiments of the present invention, application of dynamic clock switching includes generating a composite clock signal by at least selecting an alternate clock signal that passes the functional execution sequence and alternating between the alternative clock signal and a normal clock signal while executing the portion of the functional execution sequence to isolate a functional fail cycle or fail cycle range. The normal clock signal may be the signal that has been detected or set to cause the device under test to fail a particular function execution sequence.

In some embodiments of the present invention, the test and diagnostic system includes a normal clock signal generator, an alternate clock signal generator, and a clock selector multiplexer. The normal clock signal generator is configured to generate a functional clock signal having a rate that causes the device under test to fail the function execution sequence. The alternate clock signal generator is configured to generate a functional clock signal having a rate or frequency that causes the device under test to pass the function execution sequence. The clock selector multiplexer is configured to a switch between the generated normal clock signal and the generated alternate clock signal, and to output a composite clock signal that is applied to the device under test.

In some embodiments of the present invention, the normal clock signal and the alternate clock signal are generated based at least in part on a programmable digital phase locked look (DPLL) function.

In some embodiments of the present invention, applying dynamic clock switching includes generating a composite clock signal by at least modifying at least one of an LE or TE of a normal clock signal. The normal clock signal can be a signal that has been detected or set to cause the device under test to fail the function execution sequence. In some embodiments of the present invention, the modification of the at least one of an LE or TE of a normal clock signal includes switching dynamically between a variable leading edge delay of the normal clock signal and a variable TE delay of the normal clock signal.

In some embodiments of the present invention, the test and diagnostic system includes a normal clock signal generator, a variable LE delay function, a variable TE delay function, a cycle delay function, a modified leading edge or TE selection multiplexer, and a clock selector multiplexer. The normal clock signal generator is configured to generate a functional clock signal having a rate that causes the device under test to fail the function execution sequence. The variable LE delay function is configured to modify the normal clock signal by shifting an LE of the generated normal clock signal for a specified start and stop range. The variable TE delay function is configured to modify the generated normal clock signal by shifting a TE of the generated normal clock signal for the specified start and stop range. The cycle delay function is configured to delay the normal clock signal by a given cycle (e.g., ¼ cycle). The modified LE or TE selection multiplexer is configured to switch between an output of the variable LE delay function and the variable TE delay function, and output a modified LE and/or TE clock signal. The clock selector multiplexer is configured to switch between the generated normal clock signal and the modified LE and/or TE clock signal and outputs a composite clock signal that is applied to the device under test.

Figure 11:
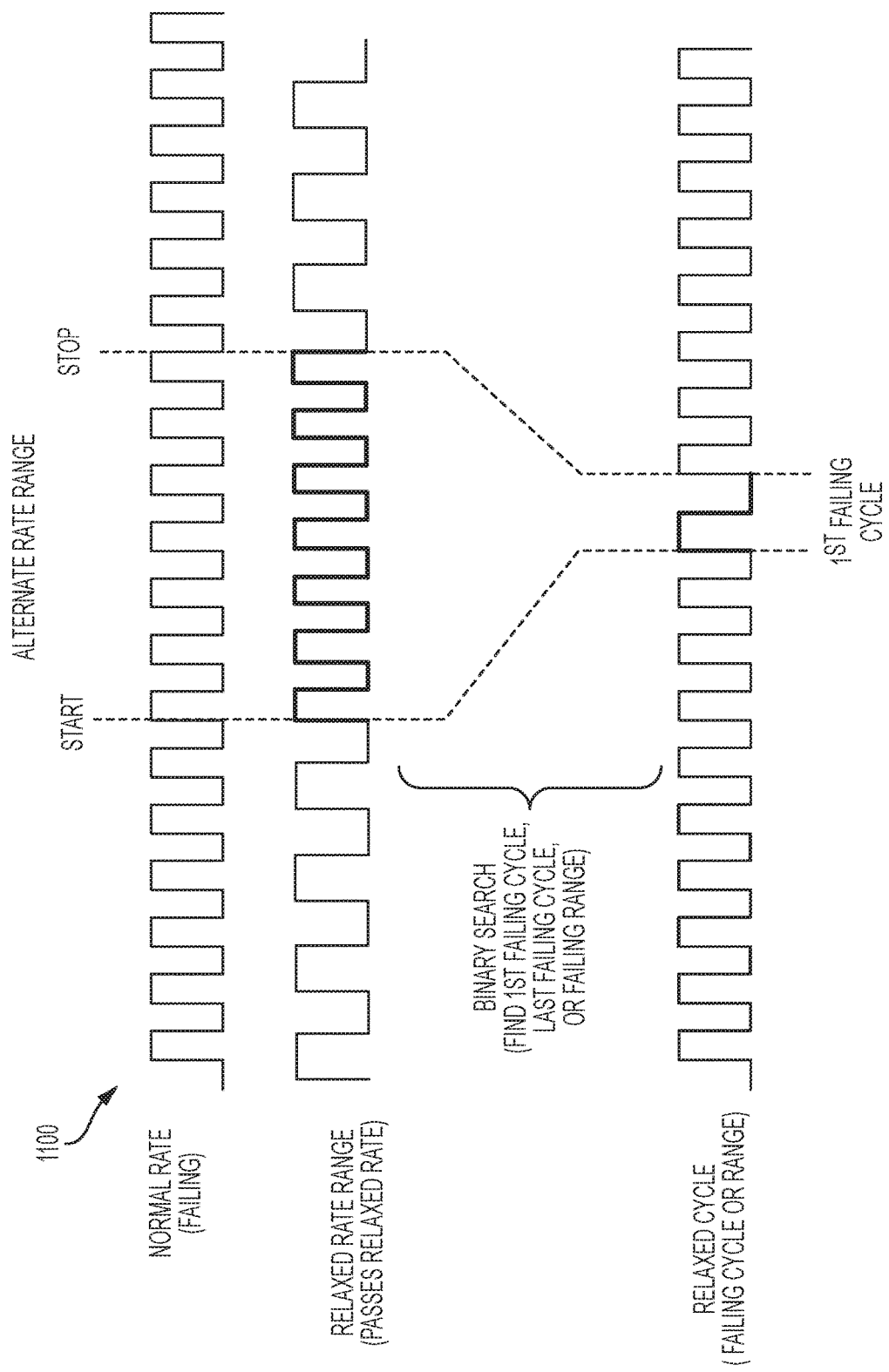
FIG. 11 illustrates another example timing overview of an alternate clock rate selection function that implements dynamic clock switching in accordance with one or more embodiments of the present invention.
Figure 12:
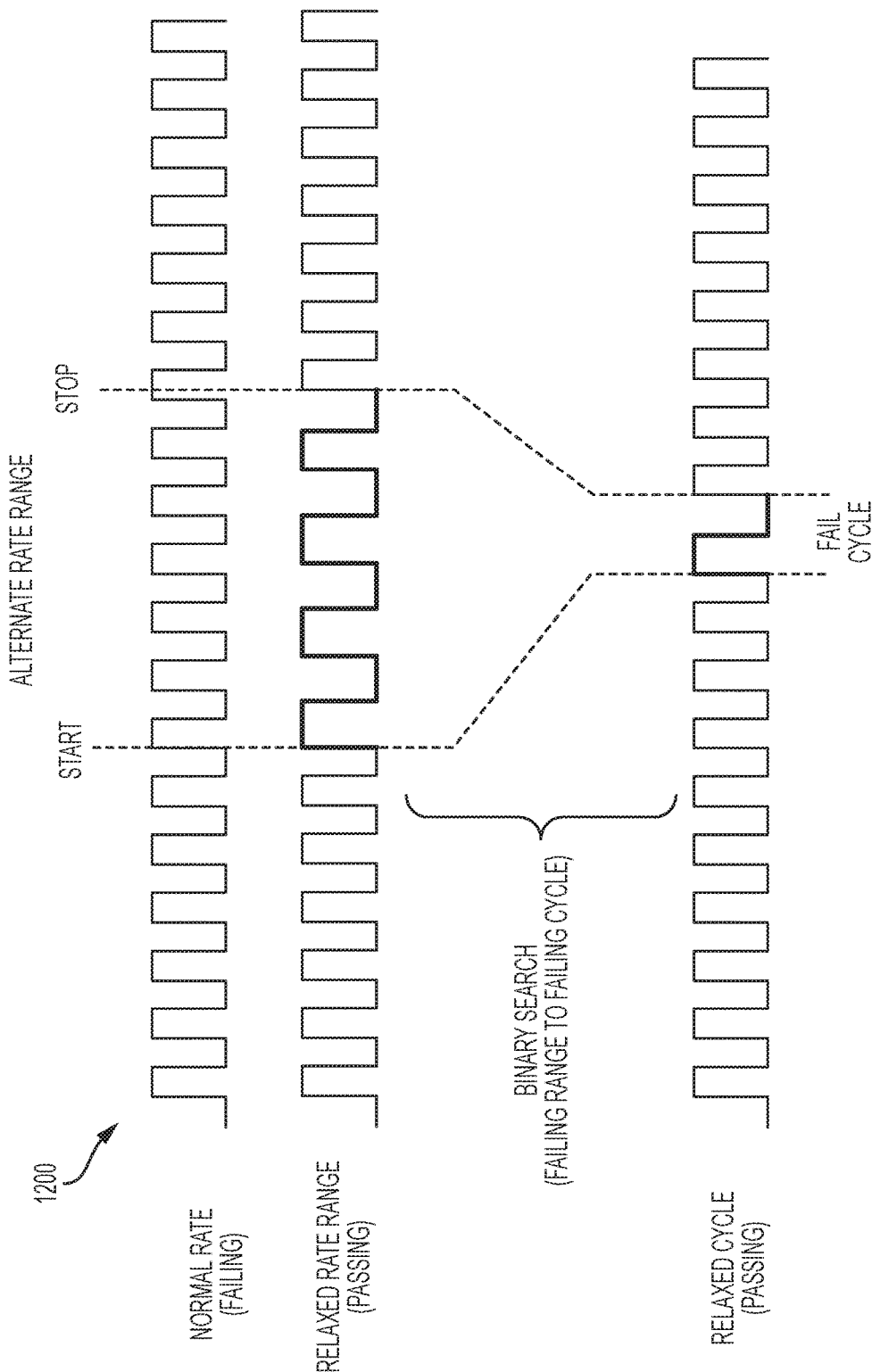
FIG. 12 illustrates another example timing overview of an alternate clock rate selection function that implements dynamic clock switching in accordance with one or more embodiments of the present invention.

FIGS. 11-12 show two examples of alternate rate range selection 1100, 1200 in which the start and stop range is narrowed down via binary search. The alternate rate range 1100 shown in FIG. 10 describes an embodiment in which the relax rate range signal (e.g., the alternate clock signal) is progressively narrowed done using binary search to find the first failing cycle, the last failing cycle, or a failing range. The alternate rate range 1100 shown in FIG. 11 describes an embodiment in which the relax rate range signal (e.g., the alternate clock signal) is progressively narrowed down by binary searching from a failing range to a failing cycle.

Figure 13:
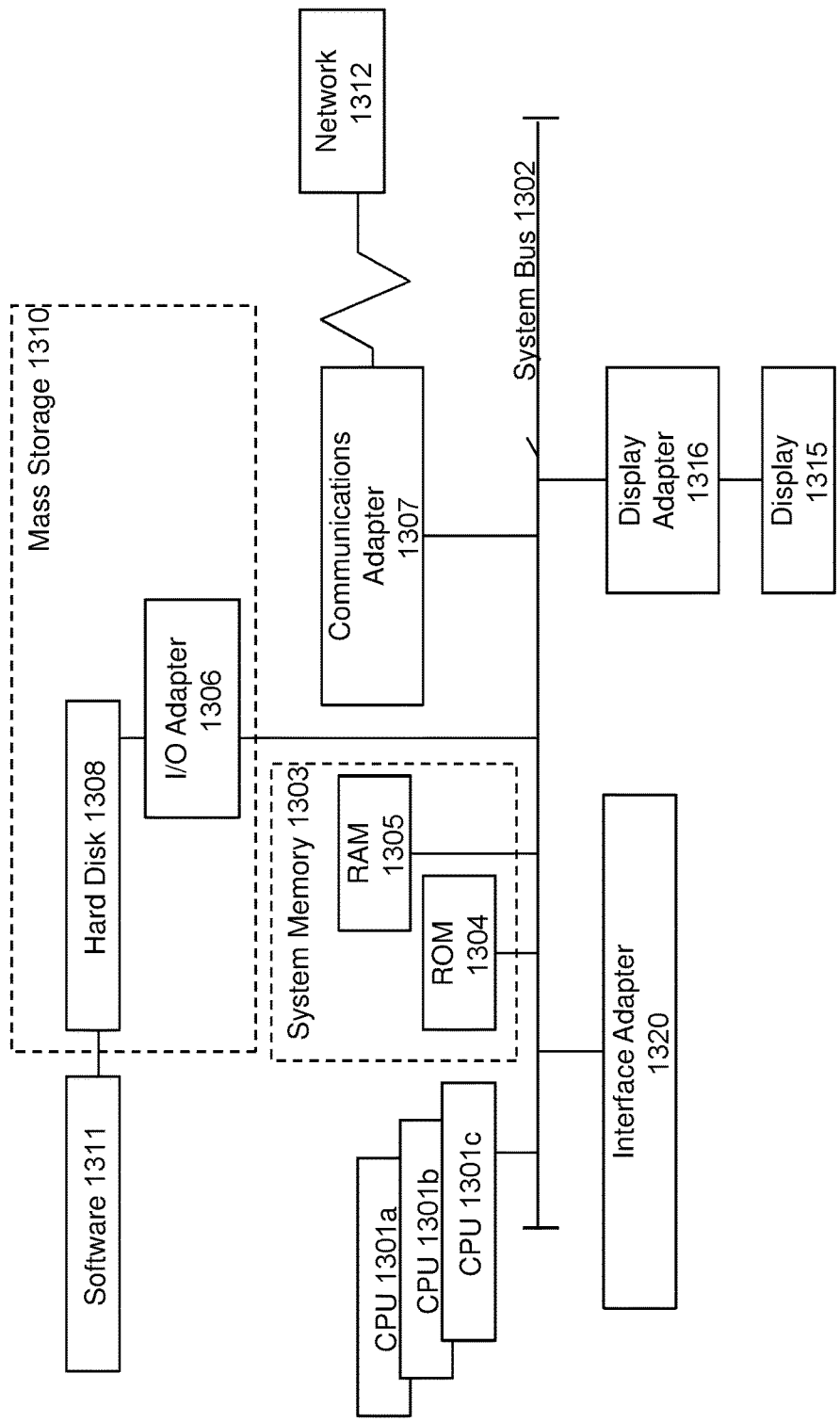
FIG. 13 illustrates a processing system in accordance with one or more embodiments of the present invention.

Referring now to FIG. 13, there is shown an embodiment of a processing system 1300 for implementing the teachings herein. In this embodiment, the processing system 1300 has one or more central processing units (processors) 1301a, 1301b, 1301c, etc. (collectively or generically referred to as processor(s) 1301) that can be an embodiment of the processor 104 of FIG. 1. The processors 1301, also referred to as processing circuits, are coupled via a system bus 1302 to a system memory 1303 and various other components (such as one or more DUT 112 of FIG. 1). The system memory 1303 can include read only memory (ROM) 1304 and random access memory (RAM) 1305. The ROM 1304 is coupled to system bus 1302 and may include a basic input/output system (BIOS), which controls certain basic functions of the processing system 1300. RAM 1305 is read-write memory coupled to system bus 1302 for use by the processors 1301.

FIG. 13 further depicts an input/output (I/O) adapter 1306 and a communications adapter 1307 coupled to the system bus 1302. I/O adapter 1306 may be a small computer system interface (SCSI) adapter that communicates with a hard disk 1308 and/or any other similar component. I/O adapter 1306 and hard disk 1308 are collectively referred to herein as mass storage 1310. Software 1311 for execution on the processing system 1300 may be stored in mass storage 1310. The mass storage 1310 is an example of a tangible storage medium readable by the processors 1301, where the software 1311 is stored as instructions for execution by the processors 1301 to perform a method, such as process flows 700, 800, 1000 of FIGS. 7, 8, and 10. Communications adapter 1307 interconnects the system bus 1302 with an outside network 1312 enabling processing system 1300 to communicate with other such systems. A display 1315 is connected to system bus 1302 via a display adapter 1316, which may include a graphics controller to improve the performance of graphics intensive applications and a video controller. In one embodiment, adapters 1306, 1307, and 1316 may be connected to one or more I/O buses that are connected to the system bus 1302 via an intermediate bus bridge (not shown). Suitable I/O buses for connecting peripheral devices such as hard disk controllers, network adapters, and graphics adapters typically include common protocols, such as the Peripheral Component Interconnect (PCI). Additional I/O devices can be connected to the system bus 1302 via an interface adapter 1320 and the display adapter 1316. A keyboard, mouse, and speaker can be interconnected to the system bus 1302 via the interface adapter 1320, which may include, for example, a Super I/O chip integrating multiple device adapters into a single integrated circuit.

Thus, as configured in FIG. 13, the processing system 1300 includes processing capability in the form of processors 1301, storage capability including the system memory 1303 and the mass storage 1310, input means such as keyboard and mouse, and output capability including speaker and the display 1315. In one embodiment, a portion of the system memory 1303 and the mass storage 1310 collectively store an operating system, such as the z/OS or AIX operating system from IBM Corporation, to coordinate the functions of the various components shown in FIG. 13.

The present invention may be a system, a method, and/or a computer program product at any possible technical detail level of integration. The computer program product may include a computer readable storage medium (or media) having computer readable program instructions thereon for causing a processor to carry out aspects of the present invention.

Technical effects and benefits include increased efficiency testing and fault cause isolation for a device under test. Embodiments support detection of intermittent fails while using at-speed functional test and diagnostics. Embodiment use built-in test support features for diagnostics at production and/or after deployment in the field.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions which execute via the processor of the computer or other programmable data processing apparatus, which creates means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions which comprises one or more executable instructions for implementing the specified logical function(s). In some alternative implementations, the functions noted in the blocks may occur out of the order noted in the Figures. For example, two blocks shown in succession may, in fact, be executed substantially concurrently or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system for functional test and diagnostics of integrated circuits, the system comprising:
   a device under test comprising one or more functional test exercisers; and
   a test and diagnostic system comprising a processor operable to initiate execution of a functional execution sequence in the one or more functional test exercisers up to one or more checkpoints, apply dynamic clock switching to a clock of the device under test to identify one or more likely causes of a failure identified at the one or more checkpoints, and iteratively invoke a portion of the functional execution sequence between a plurality of the checkpoints to progressively isolate the one or more likely causes of the failure as a most likely failure source based at least in part on the applied dynamic clock switching.

2. The system of claim 1, wherein the test and diagnostic system is operable to apply a binary search between the one or more checkpoints to isolate the most likely failure source, wherein the failure source includes a functional fail cycle or cycle range that most likely caused the failure.

3. The system of claim 1, wherein the test and diagnostic system is operable to apply dynamic clock switching by generating a composite clock signal and searching between the one or more checkpoints using binary search to isolate the most likely failure source, wherein the failure source includes a functional fail cycle or cycle range that most likely caused the failure.

4. The system of claim 1, wherein the test and diagnostic system includes:
   a normal clock signal generator that generates a functional clock signal having a rate that causes the device under test to fail the function execution sequence;
   an alternate clock signal generator that generates a functional clock signal having a rate or frequency that causes the device under test to pass the function execution sequence; and
   a clock signal selector multiplexer that switches between the generated normal clock signal and the generated alternate clock signal, and outputs a composite clock signal that is applied to the device under test.

5. The system of claim 4, wherein at least one of the normal clock signal and the alternate clock signal is generated based at least in part on a programmable digital phase locked look (DPLL) function.

6. The system of claim 1, wherein the test and diagnostic system is operable to apply dynamic clock switching by generating a composite clock signal by at least modifying at least one of a leading edge or trailing edge of a normal clock signal, wherein the normal clock signal causes the device under test to fail the function execution sequence, and wherein modifying the at least one of a leading edge or trailing edge of a normal clock signal includes switching dynamically between a variable leading edge delay of the normal clock signal and a variable trailing edge delay of the normal clock signal.

7. The system of claim 1, wherein the test and diagnostic system includes:
   a normal clock signal generator that generates a functional clock signal having a rate that causes the device under test to fail the function execution sequence;

a variable leading edge delay function that modifies the generated normal clock signal by shifting a leading edge of the generated normal clock signal for a specified start and stop range;

a variable trailing edge delay function that modifies the generated normal clock signal by shifting a trailing edge of the generated normal clock signal for the specified start and stop range;

a cycle delay function that delays the generated normal clock signal by a give cycle;

a modified leading edge or trailing edge selection multiplexer that switches between an output of the variable leading edge delay function and the variable trailing edge delay function, and outputs a modified leading edge and/or trailing edge clock signal; and a clock signal selector multiplexer that switches between the generated normal clock signal and the modified leading edge and/or trailing edge clock signal, and outputs a composite clock signal that is applied to the device under test.

8. A computer program product comprising a computer readable storage medium having program instructions embodied therewith, wherein the computer readable storage medium is not a transitory signal per se, the program instructions executable by a processor to cause the processor to perform a method comprising:

executing, by a test and diagnostic system, one or more functional test exercisers in a functional execution sequence for a device under test up to one or more checkpoints;

applying, by the test and diagnostic system, dynamic clock switching to a clock of the device under test to identify one or more likely causes of a failure identified at the one or more checkpoints; and iteratively invoking, by the test and diagnostic system, a portion of the functional execution sequence between a plurality of the checkpoints to progressively isolate the one or more likely causes of the failure as a most likely failure source based at least in part on the applied dynamic clock switching.

9. The computer program product of claim 8, wherein applying dynamic clock switching comprises generating a composite clock signal by at least selecting an alternate clock signal that passes the functional execution sequence and alternating between the alternative clock signal and a normal clock signal while executing the portion of the functional execution sequence to isolate a functional fail cycle or fail cycle range, wherein the normal clock signal causes the device under test to fail the function execution sequence.

10. The computer program product of claim 9, wherein at least one of the normal clock signal and the alternate clock signal is generated based at least in part on a programmable digital phase locked look (DPLL) function.

11. The computer program product of claim 8, wherein the test and diagnostic system includes:

a normal clock signal generator that generates a functional clock signal having a rate that causes the device under test to fail the function execution sequence;

an alternate clock signal generator that generates a functional clock signal having a rate or frequency that causes the device under test to pass the function execution sequence; and a clock selector multiplexer that switches between the generated normal clock signal and the generated alternate clock signal, and outputs a composite clock signal that is applied to the device under test.

12. The computer program product of claim 8, wherein applying dynamic clock switching comprises generating a composite clock signal by at least modifying at least one of a leading edge or trailing edge of a normal clock signal, wherein the normal clock signal causes the device under test to fail the function execution sequence, and wherein modifying the at least one of a leading edge or trailing edge of a normal clock signal includes switching dynamically between a variable leading edge delay of the normal clock signal and a variable trailing edge delay of the normal clock signal.

13. The computer program product of claim 8, wherein the test and diagnostic system includes:

a normal clock signal generator that generates a functional clock signal having a rate that causes the device under test to fail the function execution sequence;

a variable leading edge delay function that modifies the generated normal clock signal by shifting a leading edge of the generated normal clock signal for a specified start and stop range;

a variable trailing edge delay function that modifies the generated normal clock signal by shifting a trailing edge of the generated normal clock signal for the specified start and stop range;

a cycle delay function that delays the generated normal clock signal by a give cycle;

a modified leading edge or trailing edge selection multiplexer that switches between an output of the variable leading edge delay function and the variable trailing edge delay function, and outputs a modified leading edge and/or trailing edge clock signal; and a clock signal selector multiplexer that switches between the generated normal clock signal and the modified leading edge and/or trailing edge clock signal and outputs a composite clock signal that is applied to the device under test.

* * * * *